United States Patent
Chen et al.

(10) Patent No.: US 12,302,508 B2
(45) Date of Patent: May 13, 2025

(54) TEMPORARY CARRIER AND METHOD FOR MANUFACTURING CORELESS SUBSTRATE THEREBY

(71) Applicant: Zhuhai ACCESS Semiconductor Co., Ltd, Guangdong (CN)

(72) Inventors: Xianming Chen, Guangdong (CN); Jian Peng, Guangdong (CN); Jida Zhang, Guangdong (CN); Benxia Huang, Guangdong (CN); Lei Feng, Guangdong (CN); Bingsen Xie, Guangdong (CN); Jun Gao, Guangdong (CN)

(73) Assignee: Zhuhai ACCESS Semiconductor Co., Ltd, Guangdong (CN)

( * ) Notice: Subject to any disclaimer, the term of this patent is extended or adjusted under 35 U.S.C. 154(b) by 153 days.

(21) Appl. No.: 17/829,253

(22) Filed: May 31, 2022

(65) Prior Publication Data
US 2022/0295646 A1     Sep. 15, 2022

Related U.S. Application Data

(62) Division of application No. 17/038,898, filed on Sep. 30, 2020, now Pat. No. 11,399,440.

(30) Foreign Application Priority Data

Jun. 24, 2020   (CN) .......................... 202010592220.3

(51) Int. Cl.
H05K 3/46     (2006.01)
H05K 1/03     (2006.01)
H05K 3/02     (2006.01)

(52) U.S. Cl.
CPC .......... *H05K 3/4682* (2013.01); *H05K 1/036* (2013.01); *H05K 3/022* (2013.01); *H05K 2201/0355* (2013.01); *H05K 2203/0152* (2013.01)

(58) Field of Classification Search
CPC .... H05K 1/0271; H05K 1/036; H05K 1/0366; H05K 2201/0355; H05K 2203/0152; H05K 3/007; H05K 3/022; H05K 3/064; H05K 3/4602; H05K 3/4682
See application file for complete search history.

(56) References Cited

U.S. PATENT DOCUMENTS

| | | | | |
|---|---|---|---|---|
| 5,262,247 A * | 11/1993 | Kajiwara | ............... | H05K 3/025 |
| | | | | 428/607 |
| 7,346,982 B2 * | 3/2008 | Kim | .................... | H05K 3/4682 |
| | | | | 156/289 |
| 8,580,066 B2 * | 11/2013 | Yamada | ............... | H05K 3/4682 |
| | | | | 156/289 |
| 2003/0043316 A1 * | 3/2003 | Matsumoto | ........... | G02F 1/1347 |
| | | | | 349/84 |

(Continued)

FOREIGN PATENT DOCUMENTS

JP         2016004812 A *  1/2016  ............... H05K 1/03

*Primary Examiner* — William H. Mayo, III
*Assistant Examiner* — Rhadames Alonzo Miller
(74) *Attorney, Agent, or Firm* — The PL Law Group, PLLC

(57) ABSTRACT

A temporary carrier according to an embodiment of the present invention may include a core layer, a first Cu foil layer and a second Cu foil layer on surfaces of both sides of the core layer. Each of the first Cu foil layer and the second Cu foil layer may include double Cu foils which are physically attached together.

8 Claims, 5 Drawing Sheets

(56) References Cited

U.S. PATENT DOCUMENTS

| | | | | |
|---|---|---|---|---|
| 2007/0059917 A1* | 3/2007 | Mok | .................... | H05K 3/1258 |
| | | | | 438/618 |
| 2011/0284496 A1* | 11/2011 | Yamanishi | ................ | C23F 1/02 |
| | | | | 216/20 |
| 2012/0205039 A1* | 8/2012 | Yamada | ............... | H05K 3/4682 |
| | | | | 156/247 |

* cited by examiner

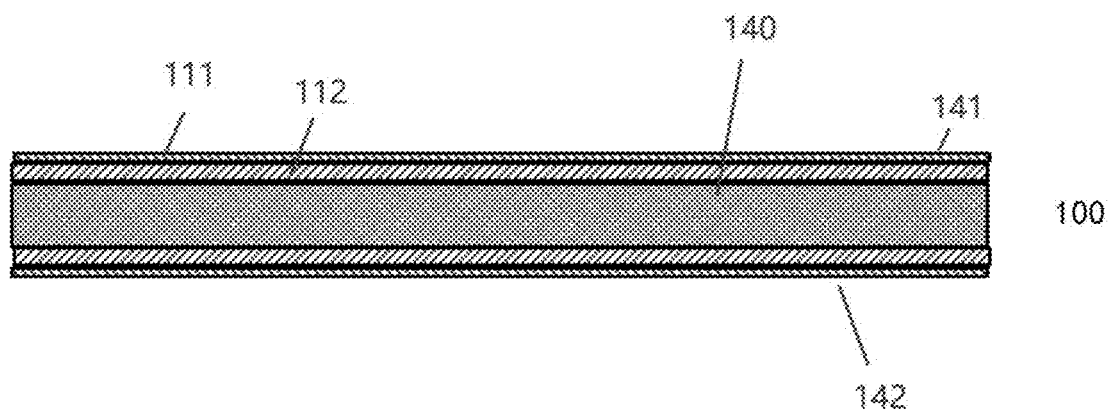
Fig. 1
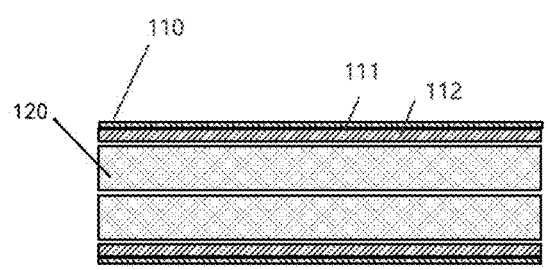 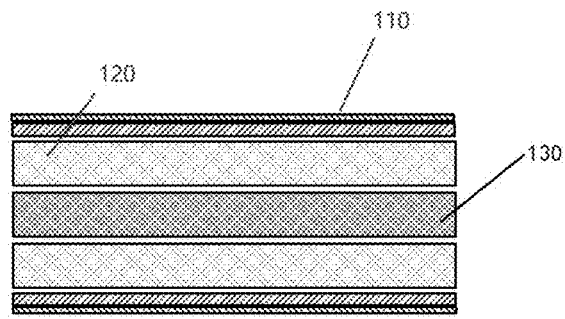
Fig. 2(a)    Fig. 2(b)

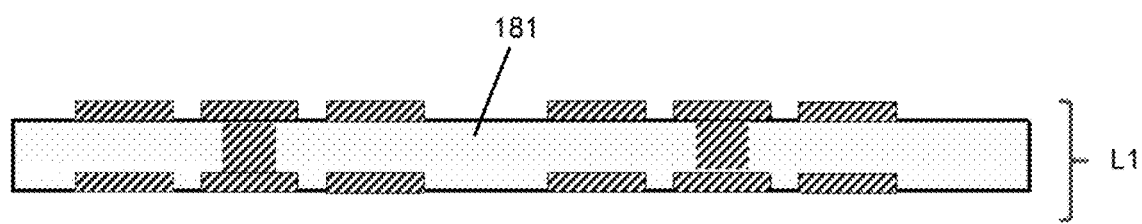
Fig.(3h)

TEMPORARY CARRIER AND METHOD FOR MANUFACTURING CORELESS SUBSTRATE THEREBY

CROSS-REFERENCE TO RELATED APPLICATION AND CLAIM OF PRIORITY

The present application is a divisional application of U.S. patent application Ser. No. 17/038,898, filed Sep. 30, 2020, which claims priority to Chinese Patent Applications No. 202010592220.3 filed on Jun. 24, 2020 in the Chinese Intellectual Property Office, the entire disclosure of which is incorporated by reference herein.

BACKGROUND

1. Field of the Invention

The present invention relates to temporary carrier, and specifically to a temporary carrier used for manufacturing a coreless substrate and a method for manufacturing a coreless substrate.

2. Description of the Related Art

Now, the elements of all electronic products search for lighter, thinner, shorter and smaller, and thus it is required that the PCB (Printed Circuit Board) carrying the elements become thinner and thinner. In the traditional processing, a core substrate is used as the PCB. However, even the core substrate can be as thick as 0.06 mm, for example, it is difficult for the apparatus to transport such thin substrate during manufacturing. Moreover, the operations of board loading and unloading by workers are prone to cause uncontrollable risks of board breaking or board bending/folding, thus significantly lowering the product yield rate.

In this regard, the technology of coreless substrate is developed accordingly. The key for the technology of coreless substrate lies in that the layer building up is performed in advance on a temporary carrier to a certain thickness of the substrate, sufficient for safe operations by the apparatuses and the workers, such as a thickness of 0.08 mm or 0.1 mm, and then the temporary carrier is removed and the subsequent processes are performed. Therefore, the temporary carrier is a key factor for early operation of layer building up of the coreless substrate.

The Chinese patent publication CN101241861B discloses a multiple layer coreless supporting structure and a manufacturing method thereof, wherein a metal carrier, such as Cu plate, is used as the temporary carrier. After completion of layer building up in the early stage, an etching method is generally used to remove the metal carrier. The metal carrier has a thickness of 0.2 mm to 0.3 mm so as to achieve an optimum combination for both supporting strength and cost. The metal carrier, such as Cu plate, with such thickness is generally made by a calendering method and it is inevitable to form a large number of protrusions and recesses on the surface of the Cu plate, with a depth of about 3 to 8 μm. Generally, a method of electroplating or vapor deposition can be used to form a layer of etching resisting layer on the metal carrier, but the defects on the Cu foil would be copied just to the resisting layer. In the process of etching off the metal carrier, an etching amount of at least 0.25 to 0.35 mm is necessary to complete the etching. The etching liquid can easily pass through the defect position(s), penetrating the resisting layer to damage or corrode the circuit layer or Cu column layer. Because the coreless substrate generally has a small thickness for the circuit layer (10 to 40 um) and Cu column (30 to 100 um), much smaller than the etching amount for etching the carrier, the product made by the metal carrier has a high defect rate. In addition, the metal carrier having a thickness of 0.2 mm to 0.3 mm is heavy, difficult for worker carrying, apparatus capturing and transportation, unsuitable for mass production and high in cost.

The patent publication TWI425900B discloses a method for manufacturing a coreless substrate and a method for manufacturing a circuit thin board, wherein a Cu clad laminate (CCL) is used as a temporary carrier. On the CCL, a thermal resisting film is introduced which can selectively adhere the CCL, rather than an insulating layer laminated subsequently. For this thermal resisting film, as the insulating layer will be laminated directly, embedded circuits cannot be made directly, thus being limited in product designing. Moreover, as a set of new apparatuses and corresponding agents is necessary, the cost is high and is difficult to be popular.

Obviously, the technical solutions in the prior art as described above have the following technical defects: (1) high cost, low yield rate, difficult operation, layer building up operation only on single side, and low output rate; and (2) necessity for new apparatuses and materials (such as a new film coating apparatus, a new developing apparatus and liquid agent, a new film removing liquid agent material, etc.), low popularity, low processing adaptability, high cost, and serious limitation of processes on product designing.

SUMMARY

One of the objective of the present invention is to provide a temporary carrier, which can be used for manufacturing a coreless substrate, to overcome the technical defect(s) in the prior art. Another objective of the present invention is to provide a method for manufacturing a coreless substrate by such temporary carrier.

In one aspect, a temporary carrier is provided, comprising a core layer, a first Cu foil layer and a second Cu foil layer on surfaces of both sides of the core layer, wherein each of the first Cu foil layer and the second Cu foil layer comprises double Cu foils which are physically attached together.

In some embodiments, the core layer comprises at least one layer of prepreg. Preferably, the core layer comprises two layers of prepreg which are adhered together with each other and adhered with the first Cu foil layer and the second Cu foil layer, respectively. As an alternative embodiment, the core layer may further comprise a Cu clad laminate interposed between the prepregs. Preferably, the core layer has a thickness of 1 to 0.5 mm.

In some embodiments, the double Cu foils comprise an outer layer Cu foil and an inner layer Cu foil, wherein the inner layer Cu foil is thicker than the outer layer Cu foil. Preferably, the outer layer Cu foil has a thickness of 2 to 5 μm and the inner layer Cu foil has a thickness of 15 to 20 μm. More preferably, the outer layer Cu foil has a thickness of 3 μm and the inner layer Cu foil has a thickness of 18 μm.

In some embodiments, the outer layer Cu foil has a width less than that of the inner layer Cu foil such that an outer edge region of the inner layer Cu foil is revealed.

In some embodiments, etching resisting layers are applied on surfaces of the first Cu foil layer and the second Cu foil layer, covering the outer edge region to seal a gap between the outer and inner layer Cu foils. Preferably, the etching resisting layer comprises a Ni layer. More preferably, the etching resisting layer further comprises a Cu layer on the Ni layer. Preferably, the Ni layer has a thickness of 5 to 10 μm and the Cu layer has a thickness of 2 to 5 μm.

In another aspect, a method for manufacturing a coreless substrate is provided, comprising the following steps:
(a) manufacturing a temporary carrier according to any one of claims 10 and 11;
(b) performing layer building up operations on both sides of the temporary carrier;
(c) overall cutting along a cutting line coincident with the outer peripheral edge of the inner layer Cu foil;
(d) separating the double Cu foils from each other to remove the temporary carrier, and thus obtaining a first coreless substrate and a second coreless substrate.

In some embodiments, the step (a) further comprises:
(a1) laminating the first Cu foil layer and the second Cu foil layer onto the two surfaces of the core layer, wherein each of the first Cu foil layer and the second Cu foil layer comprises double Cu foils which are physically laminated and attached together;
(a2) coating a photoresist layer onto the first Cu foil layer and the second Cu foil layer and performing exposure and development thereto, wherein the outer peripheral edge of the photoresist layer is spaced from the outer peripheral edge of the first and second Cu foil layers by a distance to form an exposed outer edge region;
(a3) etching the outer layer Cu foil of the outer edge region until the inner layer Cu foils of the first and second Cu foil layers are exposed;
(a4) removing the photoresist layer.

In some embodiments, the step (a) further comprises: (a5) after removing the photoresist layer, applying an etching resisting layer onto the surface of the first and second Cu foil layers, wherein the etching resisting layer covers the outer edge region. Preferably, the etching resisting layer comprises a Ni layer. More preferably, the etching resisting layer further comprises a Cu layer on the Ni layer. Preferably, the Ni layer has a thickness of 5 to 10 μm and the Cu layer has a thickness of 2 to 5 μm.

In some embodiments, the core layer comprises at least one layer of prepreg or a Cu clad laminate interposed between the prepregs.

In some embodiments, the step (d) comprises: separating the outer layer Cu foil and the inner layer Cu coil by an external mechanical force. Preferably, when separating the outer layer Cu foil and the inner layer Cu coil by the external mechanical force, a separating angle between the outer layer Cu foil and the inner layer Cu coil is 30 to 60 degrees.

In some embodiments, the method further comprises: (e) etching off the inner layer Cu coil and the etching resisting layer on the first coreless substrate and the second coreless substrate.

In some embodiments, the method further comprises: further performing layer building up on the first and second coreless substrates to form final products.

BRIEF DESCRIPTION OF THE DRAWINGS

In order to better understand the present invention and illustrate the embodiments of the present invention, the accompanying drawings are referred to only in an exemplary way.

Now specifically referring to the figures/drawings, it should be emphasized that the specific graphical representation is provided only in an exemplary way, and only for the purpose of illustrative discussion of the preferred embodiments of the present invention. The graphical representation is provided for the reason that the figures are believed to be useful to make the principle(s) and concept(s) of the present invention understood easily. In this regard, it is intended to illustrate the structural details of the present invention only in a detail degree necessary to generally understand the present invention. In the drawings:

FIG. 1 is a schematic side view of a temporary carrier of the present invention;

FIGS. 2(a) and 2(b) are schematic side views of a temporary carrier of the present invention in two stacking manners; and FIGS. 3(a) to 3(h) schematically show intermediate structures of the steps for manufacturing a coreless substrate using the temporary carrier of the present invention.

DETAILED DESCRIPTION

Figure 3A:
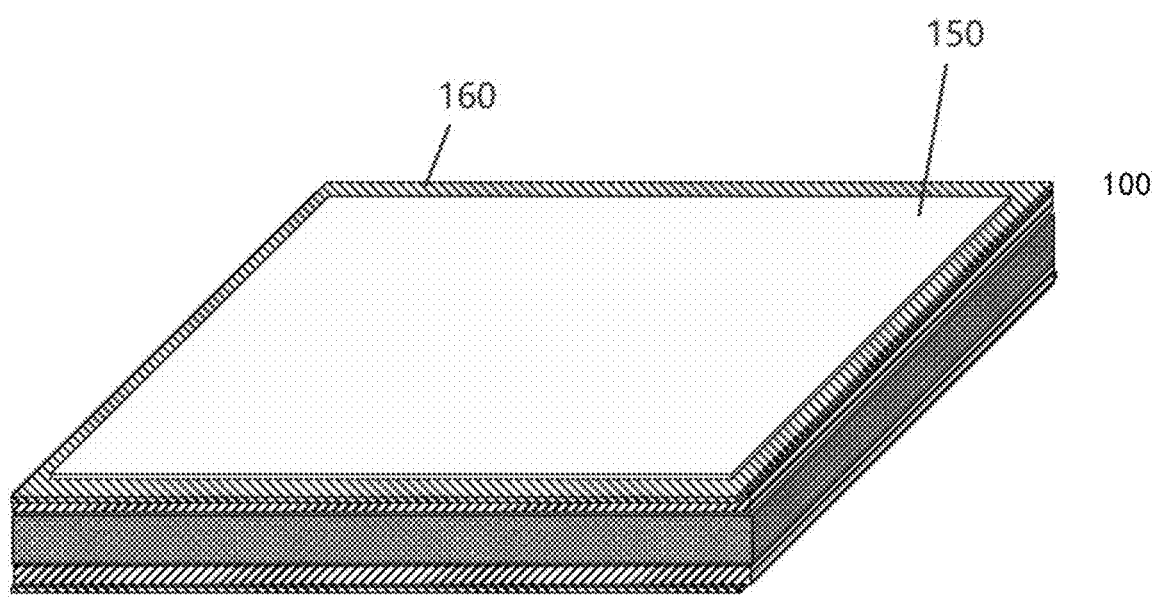

The present invention relates to a temporary carrier used for manufacturing a coreless substrate. The temporary carrier, as the initial supporting plate in the manufacturing process of a coreless substrate, functions for temporary supporting, and has a common thickness range of 0.1 mm to 0.5 mm.

As shown in FIG. 1, the temporary carrier 100 comprises a core layer 140, a first Cu foil layer 141 and a second Cu foil layer 142 on surfaces of both sides of the core layer 140, wherein each of the first Cu foil layer 141 and the second Cu foil layer 142 comprises double Cu foils which are physically attached together. Generally, the double Cu foils are bonded together by physical laminating, attached only in a physical manner, without any chemical bond therebetween. Thus, the operations of plate separation and removal of the temporary carrier in the subsequent processes can be facilitated.

Referring to FIGS. 2(a) and 2(b), in consideration of various factors such as the thickness requirement and the cost, there are generally two stacking manners for the core layer 140 and the Cu foil layers 141, 142. As shown in FIG. 2(a), in the first stacking manner, only the prepreg 120 is used as the core layer, each of the upper and lower faces is attached with the double Cu foils 110, and lamination is performed under certain temperature and pressure conditions. As shown in FIG. 2(b), in the second stacking manner, a Cu clad laminate (CCL) 130 is stacked on both sides with prepregs 120 in a certain thickness, then each of the upper and lower faces is attached with the double Cu foils 110, and lamination is performed under certain temperature and pressure conditions. In either manner, the thickness and the number of the prepregs 120 are not limited and may be selected according to the requirement of the final thickness. The prepreg 120 is made of an epoxy resin material having glass fibers therein. The Cu clad laminate (CCL) is the initial material of the process for traditional PCBs and substrates, and the use of CCL can further reduce the thickness and the cost.

The double Cu foils 110 comprise an outer layer Cu foil 111 and an inner layer Cu foil 112. Generally, the outer layer Cu foil 111 has a thickness of 2 to 5 μm, preferably 3 μm; the inner layer Cu foil 112 has a thickness of 15 to 20 μm, preferably 18 μm.

As the outer layer Cu foil 111 of the temporary carrier 100 only covers the surface of the inner layer Cu foil 112, the boundary between the outer layer Cu foil 111 and the inner layer Cu foil 112 may be split due to the coreless substrate layer building up process in a certain thickness as well as the repetitive thermal stresses (such as that in laminating and metal sputtering processes) and mechanical stresses (such as that in plate grinding and polishing processes). In particular, in the processes related to a liquid agent such as electroplating, etching, film removing, etc., the water vapor may be trapped in the split gap between the outer layer Cu foil 111 and the inner layer Cu foil 112, thus prone to cause the double Cu foils to burst out (board bursting) during processing and just cause complete failure of the product.

In this regard, it is necessary to seal the boundary between the outer layer Cu foil 111 and the inner layer Cu foil 112 to prevent water vapor from intruding. As a preferred embodiment, the double Cu foils 110 may be made such that the outer layer Cu foil 111 is narrower than the inner layer Cu foil 112 to thus reveal the outer edge region 160 of the inner layer Cu foil 112. Then, an etching resisting layer is applied onto the surface of the double Cu foils such that the etching resisting layer covers the outer edge region 160, thus completely sealing the boundary of the double Cu foils to prevent water vapor from intruding. The etching resisting layer may comprise a Ni layer. Preferably, a Cu layer is provided on the Ni layer.

As the temporary carrier of the present invention is provided on upper and lower surfaces with respective double Cu foils, it is possible to perform layer building up simultaneously on both sides during manufacturing of the coreless substrate. After the core layer 140 is removed, two coreless substrates are obtained from one plate, thus significantly reducing the processing cost.

FIGS. 3(a) to (h) schematically show intermediate structures of the steps of the method for manufacturing a coreless substrate using the temporary carrier of the present invention. Referring to FIGS. 3(a) to (h), the method comprises: obtaining a temporary carrier 100 comprising a core layer 140, a first Cu foil layer 141 and a second Cu foil layer 142 having double Cu foils; applying a photoresist layer 150 onto the surface of the Cu foil layers 141, 142 and performing exposure and development thereto (referring to FIG. 3(a), showing only one side).

The core layer 140 may be at least one prepreg (PP), or may be a CCL interposed between the PPs. The core layer 140 generally has a thickness of 0.1 to 0.5 mm to meet the requirement for substrate strength in the subsequent processes.

After the photoresist layer 150 is exposed and developed, most regions in the panel are retained, only exposing the outer edge region 160 at the periphery. The outer edge region 160 has a width (with respect to the panel edge) generally less than that of the pattern non-effective region. For example, for an exemplary panel of 510×410 mm, the effective region of the panel face is 500×400 mm and the width of the non-effective region in either X or Y direction is 10 mm. Thus, the width of the outer edge region 160 in X or Y direction may be 2 to 6 mm. The size of the outer edge region may be determined according to practical requirements, and will not be defined in the present invention.

In the present invention, the photoresist layer 150 may use a low-cost product rather than a high-resolution one. The thickness thereof is generally 15 to 25 μm so as to achieve a short reaction time of film removing.

Figure 3B:
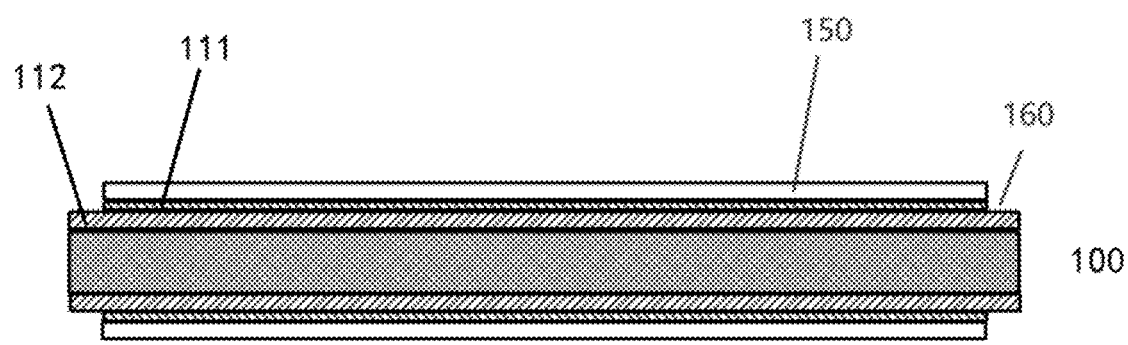

Then, using the photoresist layer 150 as a resisting layer, the outer layer Cu foil 111 at the outer edge region 160 of the temporary carrier 100 is etched until the inner layer Cu foil 112 of the first and second Cu foil layers is exposed (referring to FIG. 3(b)).

Figure 3C:
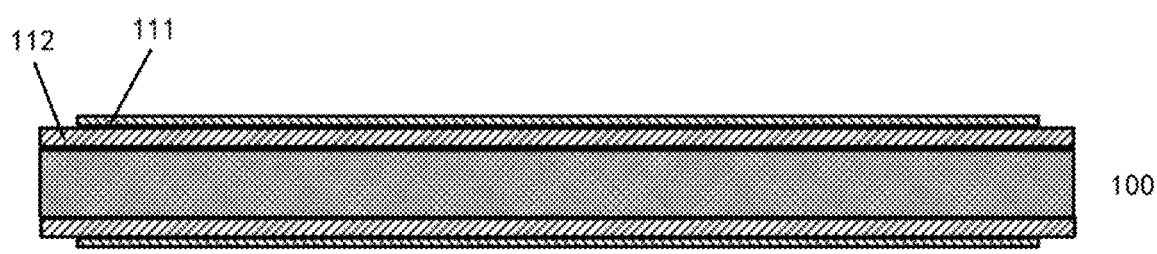

Then, the photoresist layer 150 is removed (referring to FIG. 3(c)).

Figure 3D:
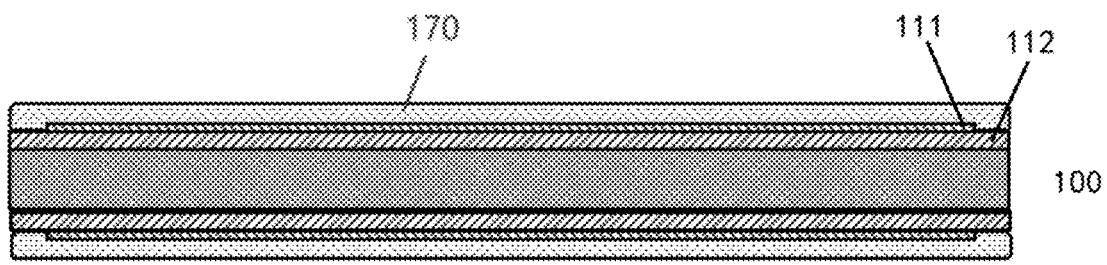

An etching resisting layer 170 is electroplated simultaneously onto the upper and lower sides (faces) of the temporary carrier 100 over the whole panel (referring to FIG. 3(d)). The etching resisting layer 170 may be a Ni layer, for example, with a thickness of 5 to 10 μm. Generally, in order to avoid oxidation and contamination of the surface of the Ni layer, a Cu layer, with a thickness of 2 to 5 μm, may be further plated onto the electroplated Ni layer. The etching resisting layer 170 mainly functions to seal the Cu coil double layers, preventing the inner and outer layer Cu foils 111, 112 of the double Cu foils from delaminating or water vapor intrusion during processing, for example.

Then, on both sides (faces) of the temporary carrier 100, the layer building up operation is performed, respectively. After the build-up is thick enough to perform the subsequent process independently, the temporary carrier 100 is cut (referring to FIG. 3(e)). After completion of the layer building up, the cutting is performed along a cutting line 180, wherein the cutting line 180 is coincident with the peripheral edge of the outer layer Cu foil 111 of the double Cu foils after etching.

Figure 3E:
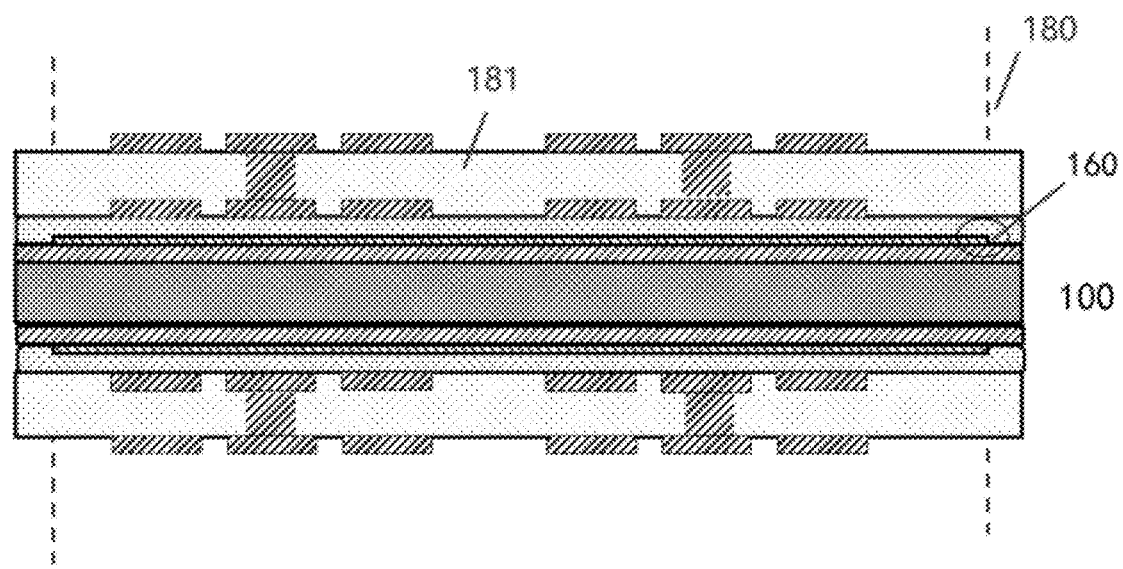
Figure 3F:
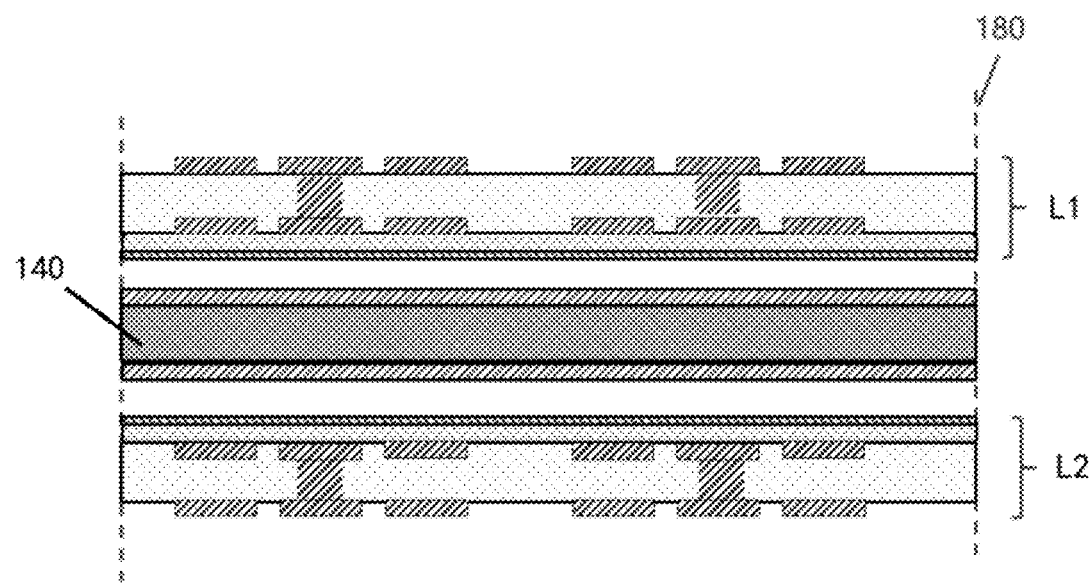

The completion of the layer building up means that the thickness after the layer building up is sufficient such that after the core layer 140 of the temporary carrier is removed, it can be carried securely during processing, with high plate bending resistance and without serious plate warping. It is possible to add only one insulating layer 181 (as shown in FIG. 3(e)) or add multiple insulating layers.

After cutting, the bonding boundary between the two layer Cu foils 111 and 112 of the temporary carrier 100 is revealed. By separating the outer layer Cu foil 111 and the inner layer Cu foil 112 of the double Cu foils 110, the core layer 140 of the temporary carrier 100 can be removed (referring to FIG. 3(f)), thus obtaining a first coreless substrate L1 and a second coreless substrate L2.

Figure 3G:
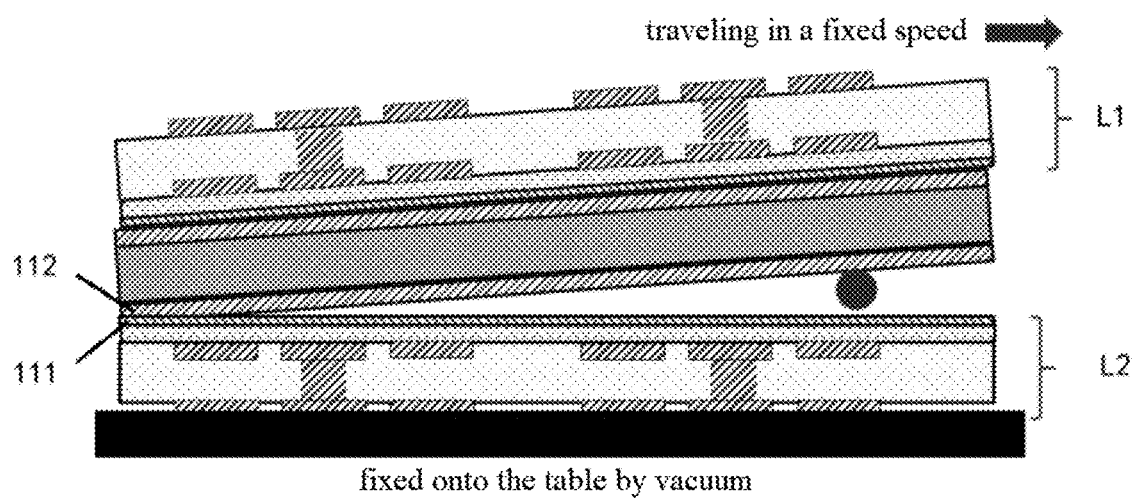

The operation of plate separation may be achieved simply by applying an external mechanical force at the bonding boundary of the double Cu foils 110. FIG. 3(g) provides an embodiment of the operation of plate separation, showing how to separate the temporary carrier 100 from the bonding portion between the double Cu foils by an external mechanical force. For example, the second board is fixed on a table and an external force is applied to the double Cu foils of the second board with an included angle of 30° to 60° because the first board may be prone to bend/fold with an angle larger than 60°. After the plate separation of the second board, the first board face is fixed on a table and is separated in the same way.

Finally, the inner layer Cu foil 112 and the etching resisting layer 170 on the first and second coreless substrates can be etched off (referring to FIG. 3(h)). Therefore, two coreless substrates can be obtained from one temporary carrier. Starting from now, in subsequent processes for the coreless substrates, the substrates to be processed become doubled in number with respect to the initial input.

The coreless substrates as thus obtained have a thickness and a strength suitable for processing, and can be further processed in the subsequent processes to obtain the final products.

The temporary carrier of the present invention is formed on both sides (faces) with the respective double Cu foils such that the operation of removal of the temporary carrier can be achieved only by mechanically separating the double Cu foils, thus significantly simplifying the operation of plate separation. In addition, the etching resisting layer is used to seal the boundary of the double Cu foils, and thus can prevent the double Cu foils from delaminating and thus board bursting due to water vapor intrusion or the like during processing. Moreover, for manufacturing substrates by means of the temporary carrier of the present invention, it is necessary to etch off only one layer of very thin Cu foil. The etching amount is very low and thus the circuit layer and the Cu column layer will not be damaged, and the etching cost is reduced. Also, the temporary carrier of the present invention is suitable for simultaneous processing on both sides, significantly improving the production efficiency. Furthermore, as it is simple in structure and easy for plate separation, the production cost of the coreless substrates can be significantly reduced.

It will be appreciated by those skilled in the art that the present invention is not limited to the contents as specifically illustrated and described above. Moreover, the scope of the present invention is defined by the appended claims, comprising combinations and sub-combinations of the various technical features as described above as well as the variations and modifications thereof, which can be anticipated by those skilled in the art by reading the above description.

What is claimed is:

1. A temporary carrier, comprising:
    a core layer;
    a first Cu foil layer and a second Cu foil layer on surfaces of both sides of the core layer,
    wherein each of the first Cu foil layer and the second Cu foil layer comprises double Cu foils which are physically attached together,
    wherein the double Cu foils comprise an outer layer Cu foil and an inner layer Cu foil, and the outer layer Cu foil has a width less than that of the inner layer Cu foil such that an outer edge region of the inner layer Cu foil is exposed,
    wherein an etching resist layer is applied on surface of the first Cu foil layer and the second Cu foil layer, and the etching resist layer covers the outer edge region of the inner layer Cu foil,
    wherein the etching resisting layer comprises a Ni layer.

2. The temporary carrier according to claim 1, wherein the core layer comprises at least one layer of prepreg.

3. The temporary carrier according to claim 2, wherein the core layer comprises two layers of prepreg which are adhered with the first Cu foil layer and the second Cu foil layer, respectively.

4. The temporary carrier according to claim 2, wherein the core layer further comprises a Cu clad laminate interposed between the prepregs.

5. The temporary carrier according to claim 1, wherein the inner layer Cu foil is thicker than the outer layer Cu foil.

6. The temporary carrier according to claim 5, wherein the outer layer Cu foil has a thickness of 2 to 5 μm and the inner layer Cu foil has a thickness of 15 to 20 μm.

7. The temporary carrier according to claim 1, wherein the etching resisting layer further comprises a Cu layer on the Ni layer.

8. The temporary carrier according to claim 7, wherein the Ni layer has a thickness of 5 to 10 μm and the Cu layer has a thickness of 2 to 5 μm.

* * * * *